United States Patent
Lee et al.

(10) Patent No.: US 7,296,617 B2
(45) Date of Patent: Nov. 20, 2007

(54) HEAT SINK

(75) Inventors: Hsieh-Kun Lee, Tu-Cheng (TW); Chun-Chi Chen, Tu-Cheng (TW); Shi-Wen Zhou, Shenzhen (CN); Meng Fu, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 148 days.

(21) Appl. No.: 11/221,285

(22) Filed: Sep. 7, 2005

(65) Prior Publication Data

US 2006/0054307 A1    Mar. 16, 2006

(30) Foreign Application Priority Data

Sep. 15, 2004   (CN)   .................. 2004 2 0088416

(51) Int. Cl.
*F28D 15/04* (2006.01)
(52) U.S. Cl. ................... 165/80.3; 165/104.21
(58) Field of Classification Search ...... 165/80.1–80.3, 165/104.21, 104.26, 104.33; 361/700
See application file for complete search history.

(56) References Cited

U.S. PATENT DOCUMENTS

| | | | |
|---|---|---|---|
| 6,651,734 B1 * | 11/2003 | Liu | 165/80.3 |
| 6,779,595 B1 * | 8/2004 | Chiang | 165/104.33 |
| 6,909,608 B2 * | 6/2005 | Fan | 361/700 |
| 6,917,522 B1 * | 7/2005 | Erturk et al. | 361/700 |
| 6,918,429 B2 * | 7/2005 | Lin et al. | 165/80.3 |
| 6,945,319 B1 * | 9/2005 | Li et al. | 165/104.33 |
| 7,188,663 B2 * | 3/2007 | Lin | 165/104.33 |
| 2003/0019610 A1 * | 1/2003 | Liu | 165/80.3 |
| 2004/0226697 A1 * | 11/2004 | Liu | 165/104.33 |
| 2005/0073811 A1 * | 4/2005 | Wang et al. | 165/80.3 |
| 2005/0183842 A1 * | 8/2005 | Lin | 165/80.2 |

FOREIGN PATENT DOCUMENTS

| | | |
|---|---|---|
| JP | 2001-223308 A | 8/2001 |
| TW | 532758 | 5/2003 |
| TW | 557122 | 10/2003 |

* cited by examiner

*Primary Examiner*—Teresa J. Walberg
(74) *Attorney, Agent, or Firm*—Morris Manning Martin LLP; Tim Tingkang Xia, esq.

(57) ABSTRACT

A heat sink for dissipating heat of an electronic device comprises a base, a first fin group comprising a plurality of fins stacked together, a second fin group comprising a plurality of fins and overlapping the first fin group, and a sinuous heat pipe attached to the base. The first and second fin groups are respectively engaged with the heat pipe twice at different locations of the first and second fin groups.

18 Claims, 3 Drawing Sheets

HEAT SINK

BACKGROUND

1. Field of the Invention

The present invention relates to a heat dissipation device for an electronic device, and particularly to a heat sink having at least a serpentine heat pipe.

2. Description of Related Art

Along with the continuous boom of computer industry, an electronic device, such as a central processing unit (CPU), is generating more and more heat. To ensure normal operation of the electronic device, accumulated heat must be removed away in time. Various heat sinks therefore have been devised to dissipate heat from electronic devices.

Conventionally, a typical heat sink conducts and dissipates heat by metal thermal conduction, and generally comprises a heat spreader for contacting the CPU for absorb heat therefrom and a plurality of fins provided on the heat spreader for dissipating heat. Limited to inherent characteristic of metal and cost consideration, heat conduction is not sufficiently fast and heat is mainly accumulated in the heat spreader. Heat dissipation capability of the heat sink does not satisfy the requirement of a high-powered heat-generating electronic device.

Nowadays, heat pipes, due to their excellent heat transfer performance, have been widely applied to heat dissipation of electronic devices. A heat pipe is a sealed metal pipe, with a low-pressure therein, in which a wick structure is formed and working fluid is filled. The heat pipe transfers heat from one end to the other by repeated phase change of working fluid between vapor and liquid states. A heat pipe has a high heat transfer performance due to fast circulation of working fluid and can transfer heat over a long distance.

Taiwan patent No. 532758 discloses a typical heat sink using heat pipes. The heat sink comprises a heat spreader for contacting a heat source, a plurality of parallel fins erecting on the heat spreader, and two U-shaped heat pipes attached to the heat spreader and extending through the fins to transfer heat from the heat spreader to the fins. The heat sink draws heat from the heat source via the heat spreader, one part of the heat is directly conducted upward to the fins; the remainder is indirectly transferred to the fins via the heat pipes. Generally, to maximize heat dissipation, the fins are made as large as possible; on the other hand, each heat pipe has a small cross-section size due to the limitations of manufacture cost and method; each of the heat pipes is brought to extend through a small circular hole defined in each fin and contact the fin. The contact between the heat pipes and the fins in the conventional heat sink is not adequate to offer a required heat transferring from the heat pipes to the fins. Vapors in heat pipes cannot sufficiently dissipate their heat to the fins through the contact between the fins and the heat pipes, whereby vapors in the heat pipes cannot totally condense into liquid and flow back to ends of the heat pipes thermally contacting with the heat spreader. Accordingly, utilization of heat transfer of the heat pipes is not high and heat dissipation of the heat sink is limited.

Therefore, it is desired to evolve an improved heat sink to overcome above-mentioned problems.

SUMMARY

Accordingly, what is needed is to provide an improved heat sink with heat pipes which has an excellent heat transfer performance by increasing contact area between the heat pipes and fins of the improved heat sink.

A heat sink for dissipating heat of an electronic device comprises a base, a first fin group comprising a plurality of fins stacked together, a second fin group comprising a plurality of fins and overlapping the first fin group, and a sinuous heat pipe attached to the base. The first and second fin groups are respectively engaged with the heat pipe twice at different locations of the first and second fin groups. The heat pipe has an evaporating portion engaging with the base and a bottom of the first fin group, a first condensing portion engaging with the a top of the first fin group and a bottom of the second fin group, and a second condensing portion engaging with an upper portion of the second fin group. The evaporating portion and the first and second condensing portions are parallel to each other.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
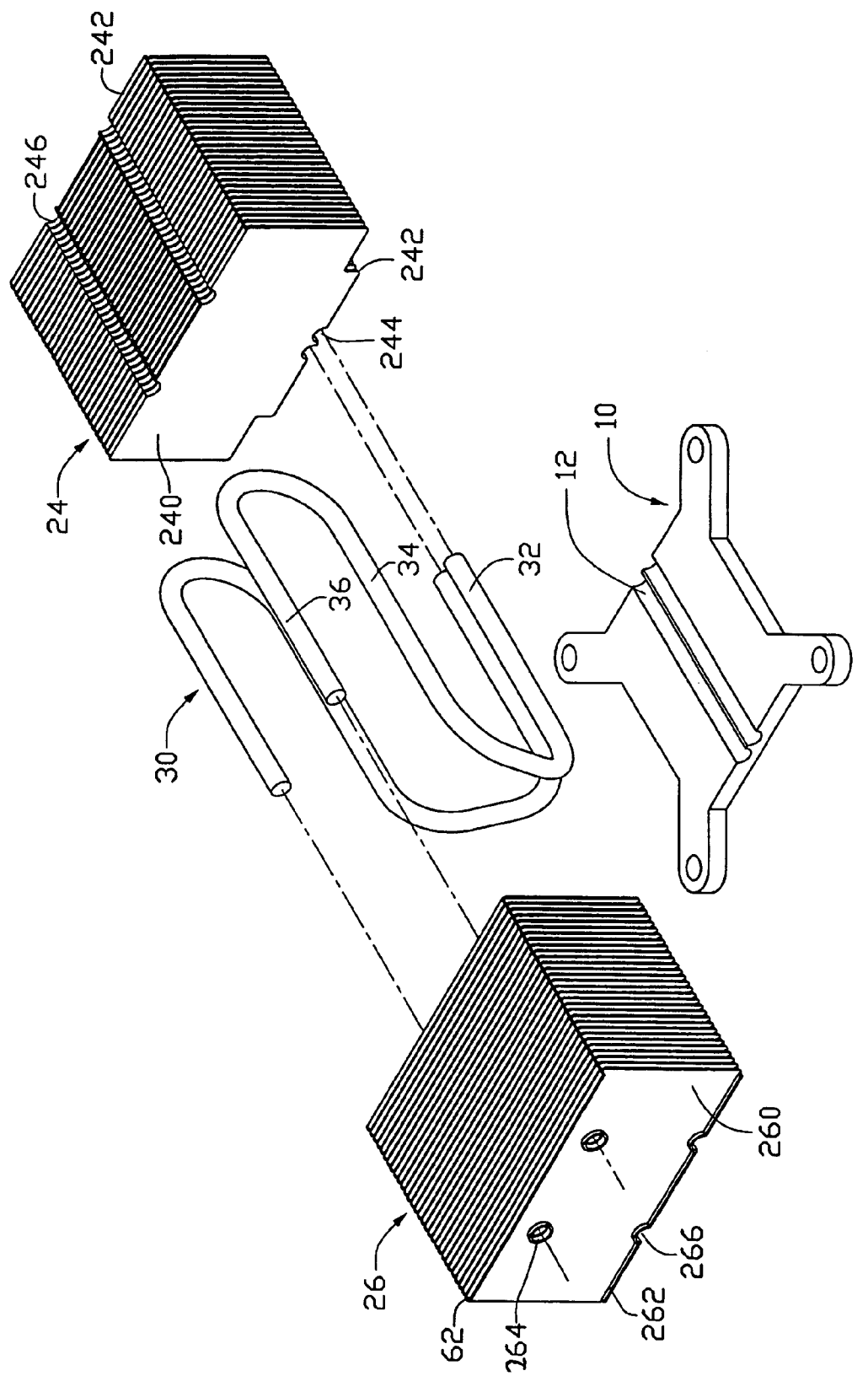
FIG. 1 is an exploded, isometric view of a heat sink in accordance with a preferred embodiment of the present invention.

Reference will now be made to the drawing figures to describe a heat sink in accordance with a preferred embodiment of the present invention.

Figure 2:
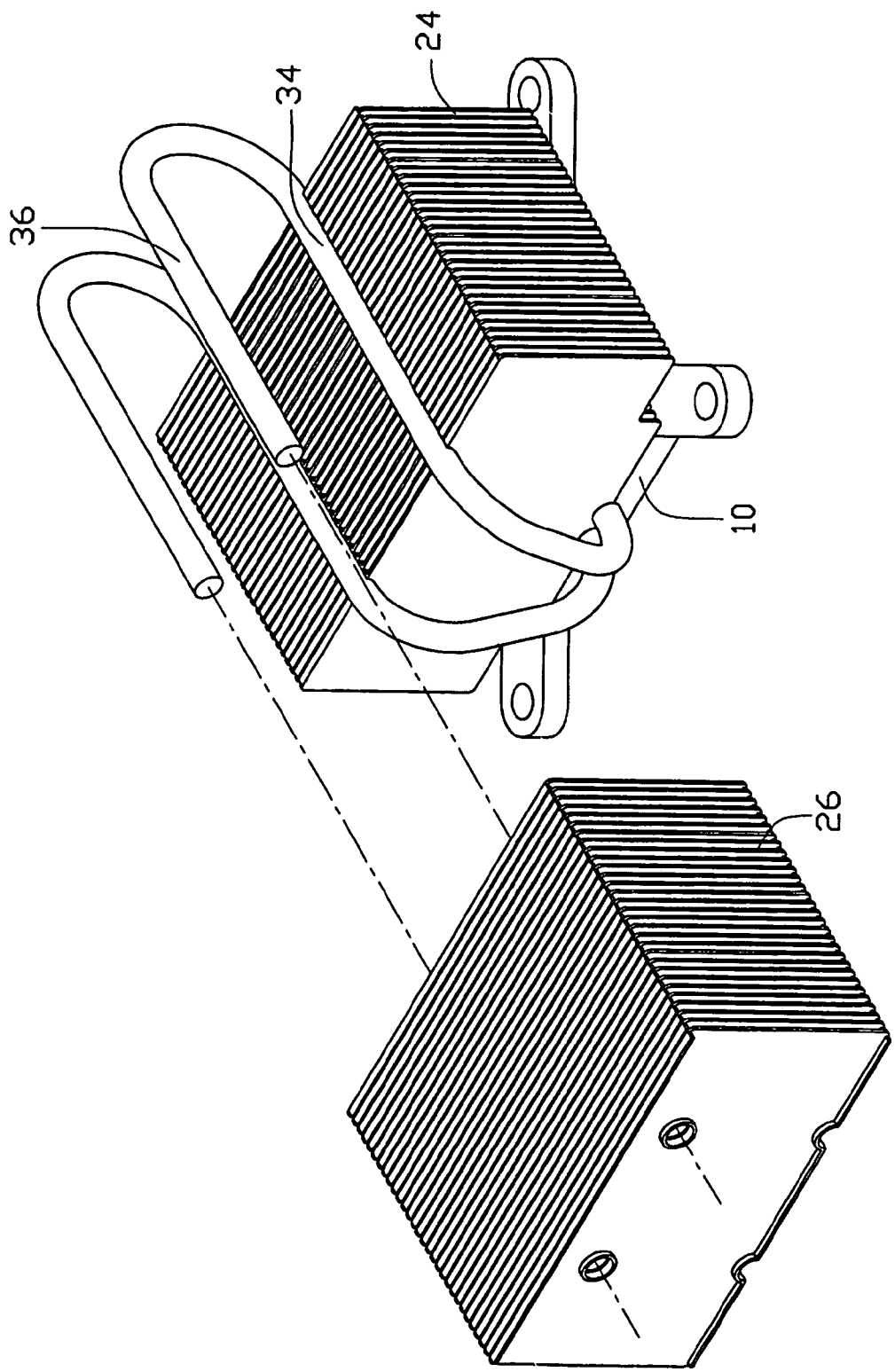
FIG. 2 is a partly assembled view of FIG. 1.
Figure 3:
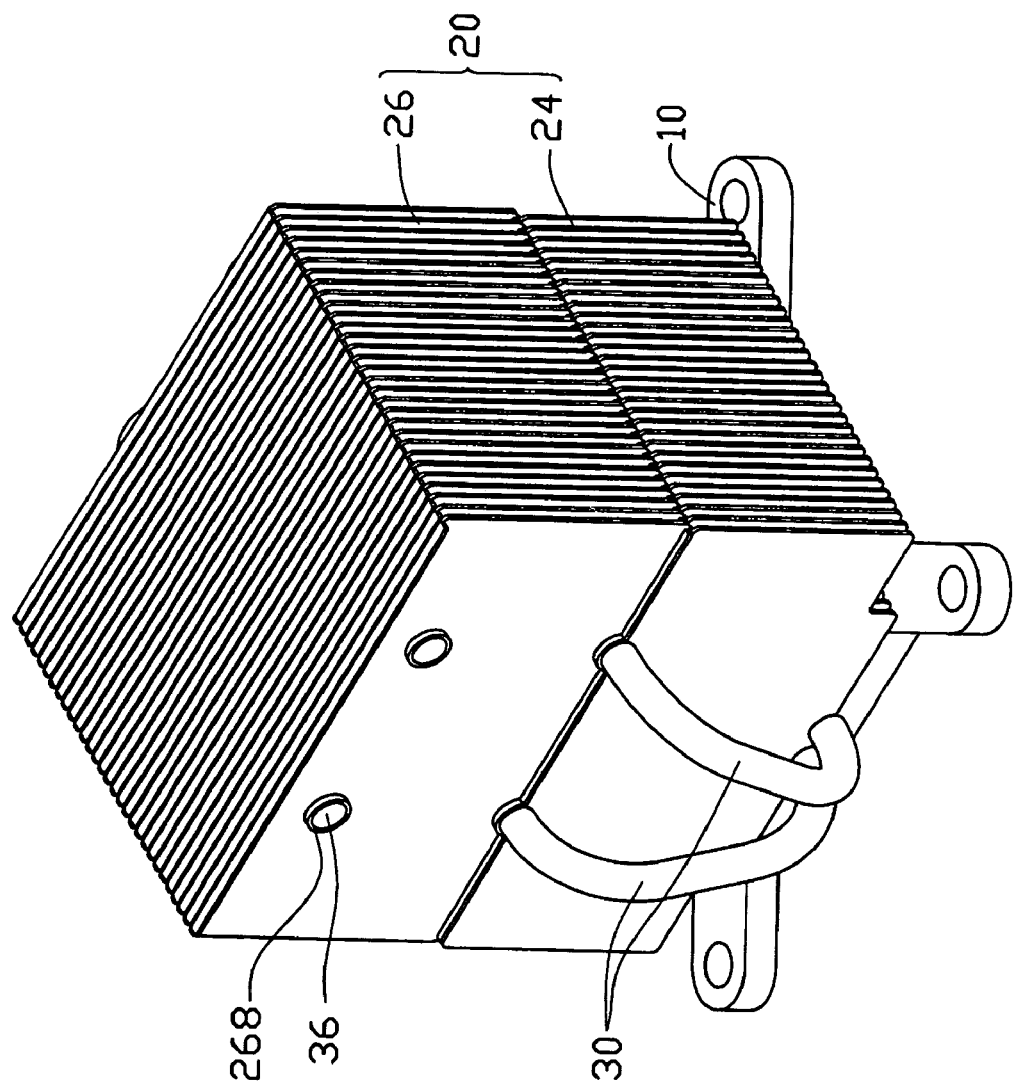
FIG. 3 is a fully assembled view of FIG. 1.

Referring to FIG. 1 to FIG. 3, the heat sink in accordance with the present invention is used for mounting to a CPU (not shown) to dissipate heat therefrom. The heat sink comprises a heat spreader 10, a fin group 20 adhered to the heat spreader 10, and two heat pipes 30 attached to the heat spreader 10 and the fin group 20.

The heat spreader 10 is a flat metal plate, preferably made of copper, having a bottom face (not visible) for contacting the CPU and a top face (not labeled) opposite to the bottom face and defining two parallel grooves 12 each having a semi-circular section.

The fin group 20 is adhered to the top face of the heat spreader 10 and comprises a first fin group 24 and a second fin group 26. The first fin group 24 contacts the heat spreader 10 and comprises a plurality of parallel first fins 240 stacked together. The first fin group 24 defines a pair of adjacent grooves 244 at a bottom thereof and a pair of separate grooves 246 at a top thereof. The first fin group 24 defines two sets of flanges 242 bent perpendicularly from top and bottom edges of the first fins 240 for spacing adjacent first fins 240. The grooves 244 are so defined that they cooperate with the grooves 12 to form two straight pipe-shaped passages when the bottom flanges 242 are attached to the top face of the heat spreader 10. When the first fin group 24 is mounted on the heat spreader 10, the fins 240 extend vertically upwardly from the heat spreader 10. The second fin group 26 is mounted on and overlaps the first fin group 24. The second fin group 26 comprises a plurality of parallel second fins 260 stacked together. The second fin group 26 and the first fin group 24 are combined together in such a manner that the first fins 240 are parallel to the second fins 260. The second fin group 26 defines a pair of separate grooves 266 at a bottom thereof and a pair of separate slots 264 adjacent a top thereof. Two sets of flanges 262 are bent perpendicularly from top and bottom edges of the second fins 260 for spacing adjacent second fins 260. An annular collar 268 is perpendicularly extended from each second fin 260 at a circumference of each slot 264. The grooves 266 are so defined that they cooperate with the grooves 246 to form two straight pipe-shaped passages when the bottom flanges 262 are engaged with the top flanges 242 of first fin group 24.

The heat pipes 30 each are bent to have an S-shaped configuration and comprises three parallel horizontal portions, namely, an evaporating portion 32, a first condensing portion 34 and a second condensing portion 36, accordingly to their functions, respectively.

The evaporating portion 32 is accommodated in said passage between the heat spreader 10 and the first fin group 24 and is thermally engaged with the heat spreader 10 and the first fin group 24. The evaporating portion 32 contacts with the flanges 242 at the bottom of the first fin group 24 forming a corresponding groove 244. The first condensing portion 34 extends through the passage between the first fin group 24 and the second fin group 26, and thermally engages with the first fin group 24 and the second fin group 26. The first condensing portion 34 contacts with the flanges 242 at the top of the first fin group 24 forming a corresponding groove 246 and the flanges 262 at the bottom of the second fin group 26 forming a corresponding groove 266. The second condensing portion 36 extends through the slot 264 of the second fin group 26 and thermally engages with the second fin group. The second condensing portion 36 contacts with the collars 268 of the second fin group 26 forming a corresponding slot 264.

To ensure that heat can be effectively transferred from the heat spreader 10 to the heat pipes 30 and evenly distributed in the fin group 20, the evaporating portions 32 of the heat pipes 30 are intimately attached to the middle portion of the heat spreader 10 and the condensing portions 34, 36 extend through the fin group 20.

When applied to the CPU, the heat sink draws heat from the CPU via the heat spreader 10. Part of the heat is straightway conducted to the bottom of the first fin group 24 for dissipation. The other of the heat is transferred along the heat pipes 30 to the top of the first fin group 24 and the bottom of the second fin group 26 via the first condensing portion 34, and to the upper portion of the second fin group 26 via the second condensing portion 36, and then dissipated to the surrounding air by the fins 240, 260. Each fin group 24, 26 absorbs heat from the heat pipes 30 at multi-points. Heat transfer from the heat pipes 30 to the fin group 20 is remarkably increased due to increased contact area between the heat pipes and the fins; accordingly, heat dissipation efficiency of the heat sink is improved/enhanced.

It is easy to modify the heat sink in accordance with the present invention by removing the heat spreader 10 from the heat sink, whereby a direct heat transfer path is established between the evaporating portions 32 of the heat pipes 30 and the CPU. In this situation, it is preferred that the evaporating portions 32 of the heat pipes 30 is processed to have a flat face coplanar with the bottom flanges 242 of the first fin group 24 so as to have a better contact with the CPU.

It is also clearly seen that the heat pipes 30 can be shaped to other configuration and contacts the first and second fin groups 24, 26 more than twice for establishing a more effective heat transfer from the heat pipe 30 to the fin group 20.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat sink for dissipating heat of an electronic device comprising:
   a first fin group comprising a plurality of fins stacked together and defining a groove in a lower face thereof, the groove extending through all of the fins of the first fin group;
   a second fin group comprising a plurality of fins and overlapping the first fin group;
   a sinuous heat pipe having an evaporating portion; and
   a heat spreader adapted for contacting with the electronic device, the heat spreader having a bottom face for being attached to the electronic device and a top face opposite to the bottom face, the top face of the heat spreader defining a groove therein corresponding to the groove of the first fin group, the two grooves cooperatively forming a passage in which the evaporating portion of the heat pipe extends;
   wherein the top face of the heat spreader connects with the lower face of the first fin group and heat in the spreader is transferred to the first fin group through both the heat pipe and the connection between the first fin group and the heat spreader; and
   wherein the first and second fin groups are respectively engaged with the heat pipe twice at different locations of the first and second fin groups.

2. The heat sink as described in claim 1, wherein the heat pipe has an S-shaped configuration and comprises a first and a second condensing portions that are parallel to the evaporating portion and engaged with the first and second fin groups.

3. The heat sink as described in claim 2, wherein the first fin group and the second fin group sandwich the first condensing portion of the heat pipe.

4. The heat sink as described in claim 3, wherein the second condensing portion of the heat pipe extends through the second fin group.

5. The heat sink as described in claim 3, wherein the first fin group and the second fin group respectively define a plurality of flanges, the flanges cooperatively defining a passage in which the first condensing portion of the heat pipe extends.

6. The heat sink as described in claim 1, wherein the groove in the top face of the heat spreader has a length which is substantially equal to that of the evaporating portion of the heat pipe.

7. A heat sink comprising:
   a base adapted for contacting with an electronic device, the base defining a bottom face for being attached to the electronic device and a top face opposite to the bottom face and defining a groove therein;
   a first fin group mounted on the top face of the base, the first fin group defining a groove in a lower surface thereof corresponding to the groove in the top face of the base, the grooves in the lower surface of the first fin group and the top face of the base cooperatively forming a passage between the top face of the base and the lower surface of the first fin group;
   a second fin group overlapping the first fin group; and
   a heat pipe comprising an evaporating portion extending in the passage and sandwiched between the base and the first fin group, a first condensing portion sandwiched between the first fin group and the second fin group, and a second condensing portion extended through the second fin group;

wherein the top face of the base has an area substantially equal to that of the lower surface of the first fin group and the base absorbs heat from the electronic device and distributes the heat to the lower surface of the first fin group.

8. The heat sink of claim 7, wherein the evaporating portion, the first and second condensing portion are parallel to and separate from each other.

9. The heat sink of claim 8, wherein fins of the first and second fin groups are parallel to each other.

10. The heat sink of claim 7, wherein the heat pipe is continuous and sinuous.

11. The heat sink of claim 7, wherein flanges are formed at the first and second fin groups and engaged with the heat pipe.

12. A heat sink comprising:
a heat spreader having a bottom face for contacting with a heat-generating electronic device and a top face opposite to the bottom face and defining a groove therein;
a first fin group mounted on the top face of the heat spreader, the first fin group having a plurality of fins extending vertically upwardly from the heat spreader and defining a groove in a lower face thereof corresponding to the groove in the top face of the heat spreader, the two grooves cooperatively forming a passage between the top face of the heat spreader and the lower face of the first fin group;
a second fin group mounted on the first fin group; and
a heat pipe having a first portion extending in the passage between the top face of the heat spreader and the lower face of the first fin group, a second portion sandwiched between the first and second fin groups and a third portion thermally engages with the second fin group;

wherein heat in the heat spreader is simultaneously transferred to the first portion of the heat pipe and the first fin group via a connection between the heat spreader and the first fin group; and wherein the first portion of the heat pipe has a length substantially equal to that of the passage cooperatively formed by the two grooves in top face of the heat spreader and the lower face of the first fin group, respectively.

13. The heat sink of claim 12, wherein the second fin group has a plurality of fins extending parallel to the fins of the first fin group.

14. The heat sink of claim 12, wherein the heat pipe has an S-shaped configuration.

15. The heat sink of claim 13, wherein the heat pipe has an S-shaped configuration.

16. The heat sink of claim 15, wherein the first portion is an evaporating portion of the heat piper, and the first, second and third portions of the heat pipe are substantially parallel to each other.

17. The heat sink of claim 16, wherein the second fin group defines a slot therein, and the third portion of the heat pipe extends in the second fin group.

18. The heat sink of claim of claim 17, wherein top and bottom of each of the first and second fin groups are formed with flanges, said flanges spacing adjacent fins of the first and second fin groups.

* * * * *